US009480154B2

(12) United States Patent
Ishikawa et al.

(10) Patent No.: US 9,480,154 B2
(45) Date of Patent: *Oct. 25, 2016

(54) POLYAMIDE RESIN, EPOXY RESIN COMPOSITIONS, AND CURED ARTICLES THEREOF

(75) Inventors: Kazunori Ishikawa, Fukuyama (JP); Makoto Uchida, Kita-ku (JP); Yasumasa Akatsuka, Sanyoonoda (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 616 days.

This patent is subject to a terminal disclaimer.

(21) Appl. No.: 11/988,593

(22) PCT Filed: Jul. 19, 2006

(86) PCT No.: PCT/JP2006/314254
§ 371 (c)(1),
(2), (4) Date: Jan. 10, 2008

(87) PCT Pub. No.: WO2007/010932
PCT Pub. Date: Jan. 25, 2007

(65) Prior Publication Data
US 2009/0081466 A1 Mar. 26, 2009

(30) Foreign Application Priority Data
Jul. 21, 2005 (JP) ................. 2005-211489

(51) Int. Cl.
| C08G 69/32 | (2006.01) |
| B32B 27/34 | (2006.01) |
| B32B 15/092 | (2006.01) |
| B32B 27/38 | (2006.01) |
| H05K 1/03 | (2006.01) |
| C08G 59/54 | (2006.01) |
| C08G 69/26 | (2006.01) |
| C08L 77/10 | (2006.01) |
| B32B 27/08 | (2006.01) |

(52) U.S. Cl.
CPC ............ *H05K 1/0353* (2013.01); *B32B 27/08* (2013.01); *B32B 27/34* (2013.01); *B32B 27/38* (2013.01); *C08G 59/54* (2013.01); *C08G 69/265* (2013.01); *C08G 69/32* (2013.01); *C08L 77/10* (2013.01); *B32B 2457/08* (2013.01); *Y10T 428/31511* (2015.04); *Y10T 428/31515* (2015.04); *Y10T 428/31522* (2015.04); *Y10T 428/31725* (2015.04)

(58) Field of Classification Search
CPC ....... B32B 27/08; B32B 27/34; B32B 27/38; B32B 2457/08; C08G 59/54; C08G 69/265; C08G 69/32; C08L 77/10; H05K 1/0353; Y10T 428/31511; Y10T 428/31515; Y10T 428/31522; Y10T 428/31725
See application file for complete search history.

(56) References Cited

U.S. PATENT DOCUMENTS

| 5,019,944 A | 5/1991 | Ishii et al. |
| 5,112,694 A | 5/1992 | Konotsune et al. ......... 428/457 |
| 5,274,071 A | 12/1993 | Santa et al. |
| 5,342,895 A | 8/1994 | Tagami et al. |
| 5,686,557 A | 11/1997 | Kiyohara et al. |
| 6,956,100 B2 | 10/2005 | Imaizumi et al. |
| 7,223,481 B2 | 5/2007 | Suzuki et al. |
| 7,608,336 B2 | 10/2009 | Akatsuka et al. |
| 7,740,936 B2 | 6/2010 | Ogawa et al. |
| 8,114,940 B2 | 2/2012 | Ishikawa et al. |
| 2003/0166796 A1 | 9/2003 | Imaizumi et al. |

(Continued)

FOREIGN PATENT DOCUMENTS

| CN | 1717430 A | 1/2006 |
| EP | 0388243 A1 | 9/1990 |

(Continued)

OTHER PUBLICATIONS

Machine translation of JP 2005-097428 (2005).*
Machine translation of JP 08-143661 (1996).*
Machine translation of JP 2003206352 (2003).*
Office Action dated May 26, 2010 in co-pending U.S. Appl. No. 11/918,975.
The European Communication dated Jun. 23, 2009.
Chinese communication dated Mar. 27, 2009.

(Continued)

*Primary Examiner* — Callie Shosho
*Assistant Examiner* — John Freeman
(74) *Attorney, Agent, or Firm* — Nields, Lemack & Frame, LLC

(57) ABSTRACT

Provided herein are a phenolic hydroxyl group-containing aromatic polyamide resin and a resin composition containing the resin, such as an epoxy resin composition containing an epoxy resin. The phenolic hydroxyl group-containing aromatic polyamide resin has a structure represented by the following formula (1):

(1)

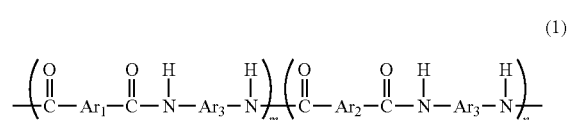

wherein m and n are average values satisfying the following formula: $0.005 \leq n/(m+n) < 0.05$, m+n is a positive value of 2 to 200, $Ar_1$ is a bivalent aromatic group, $Ar_2$ is a phenolic hydroxyl group-containing bivalent aromatic group, and $Ar_3$ is a bivalent aromatic group. Such a phenolic hydroxyl group-containing aromatic polyamide resin has a low ionic impurity content and improved adhesive properties as well as excellent properties inherent in conventional phenolic hydroxyl group-containing aromatic polyamide resins, such as the ability to allow a cured epoxy resin composition to have excellent flexibility, electrical properties, flame retardancy, and the like.

9 Claims, No Drawings

(56) References Cited

U.S. PATENT DOCUMENTS

| | | | |
|---|---|---|---|
| 2004/0024124 A1 | 2/2004 | Imaizumi et al. | 525/88 |
| 2004/0147658 A1 | 7/2004 | Matsushima et al. | 524/436 |
| 2005/0048306 A1 | 3/2005 | Suzuki et al. | |
| 2006/0003165 A1 | 1/2006 | Akatsuka et al. | 428/413 |
| 2006/0058469 A1 | 3/2006 | Akatsuka et al. | |
| 2007/0189042 A1 | 8/2007 | Pai et al. | |
| 2007/0243402 A1 | 10/2007 | Sato et al. | |
| 2008/0200636 A1 | 8/2008 | Nakanishi et al. | |
| 2009/0056982 A1 | 3/2009 | Akatsuka et al. | |
| 2009/0071697 A1 | 3/2009 | Ishikawa et al. | |
| 2009/0081466 A1 | 3/2009 | Ishikawa et al. | |
| 2010/0129604 A1 | 5/2010 | Uchida et al. | |
| 2010/0226095 A1 | 9/2010 | Mimura et al. | |
| 2011/0205721 A1 | 8/2011 | Endo | |
| 2012/0288725 A1 | 11/2012 | Tanaka et al. | |

FOREIGN PATENT DOCUMENTS

| | | | | |
|---|---|---|---|---|
| EP | 1 300 444 | | 4/2003 | |
| EP | 1 333 077 | | 8/2003 | |
| EP | 1 566 395 | | 8/2005 | |
| JP | 61-245868 | | 11/1986 | |
| JP | 62-72745 | A | 4/1987 | |
| JP | 3-47836 | A | 2/1991 | |
| JP | 3-164241 | | 7/1991 | |
| JP | 3-273026 | A | 12/1991 | |
| JP | 4-170431 | A | 6/1992 | |
| JP | 4-188792 | | 7/1992 | |
| JP | 5-163356 | A | 6/1993 | |
| JP | 6-299133 | A | 10/1994 | |
| JP | 08-143661 | | 6/1996 | |
| JP | 8-217959 | A | 8/1996 | |
| JP | 9-31154 | A | 2/1997 | |
| JP | 11-204521 | A | 7/1999 | |
| JP | 2000-313787 | A | 11/2000 | |
| JP | 2001-31784 | A | 2/2001 | |
| JP | 2001-81282 | | 3/2001 | |
| JP | 2001-219491 | A | 8/2001 | |
| JP | 2002-194282 | A | 7/2002 | |
| JP | 2003-13157 | A | 1/2003 | |
| JP | 2003206352 | A * | 7/2003 | C08G 69/28 |
| JP | 2004-142183 | A | 5/2004 | |
| JP | 2005-29720 | A | 2/2005 | |
| JP | 2005-53218 | A | 3/2005 | |
| JP | 2005-97428 | A | 4/2005 | |
| JP | 2006-310574 | A | 11/2006 | |
| JP | 2007-1291 | A | 1/2007 | |
| JP | 2007-204598 | A | 8/2007 | |
| JP | 2007-254527 | A | 10/2007 | |
| KR | 10-2005-0025277 | A | 3/2005 | |
| KR | 10-2005-0086543 | A | 8/2005 | |
| TW | 200710125 | A | 3/2007 | |
| TW | I289590 | B | 11/2007 | |
| TW | 200909519 | A | 3/2009 | |
| WO | 02/00791 | A1 | 1/2002 | |
| WO | 02/34850 | | 5/2002 | |
| WO | 2004/048436 | | 6/2004 | |
| WO | 2006/118239 | A1 | 11/2006 | |
| WO | 2007/010932 | A1 | 1/2007 | |
| WO | 2007/052523 | A1 | 5/2007 | |
| WO | 2008/143058 | A1 | 11/2008 | |
| WO | 2009/028170 | A1 | 3/2009 | |
| WO | 2009/041300 | A1 | 4/2009 | |
| WO | 2010/050472 | A1 | 5/2010 | |
| WO | 2010/058734 | A1 | 5/2010 | |

OTHER PUBLICATIONS

Singapore communication dated Mar. 30, 2009.
The International Search Report dated Jun. 6, 2006.
The OA dated Oct. 5, 2009 in co-pending U.S. Appl. No. 11/918,975.
International Search Report dated Aug. 19, 2008 in co-pending foreign application PCT/JP2008/058767.
Office Action dated Nov. 12, 2010 in co-pending U.S. Appl. No. 12/451,359.
Chinese Communication, with English translation, dated Feb. 17, 2011 in co-pending foreign application CN 200680014652.4.
JIS—Japanese Industrial Standard—JIS C 6515: 1998 (IEC 61249-5-1: 1995); "Copper foil for printed wiring boards" (21-Pages).
Taiwanese Communication, with English translation, issued Jul. 3, 2013 in co-pending Taiwanese patent application No. 097118188.
Korean Communication, with English translation, dated Jul. 2, 2012 in co-pending Korean patent application No. 10-2007-7025068.
Chinese Communication, with English Translation, dated Aug. 15, 2011 in co-pending Chinese Patent Application No. CN 200680014652.4, 7 pages.
Office Action dated Oct. 3, 2011 in co-pending U.S. Appl. No. 11/918,975.
Notice of Allowance dated Sep. 23, 2011 in co-pending U.S. Appl. No. 12/083,529.
Japanese Communication, with English translation, mailed Sep. 2, 2011 in co-pending Japanese Patent Application No. JP 2007-132160.
Taiwanese Communication, with English translation, issued Apr. 19, 2012 in co-pending Taiwanese patent application No. 095114541.
Office Action mailed Jun. 6, 2012 in co-pending U.S. Appl. No. 11/918,975.
Final Rejection mailed Feb. 15, 2012 in co-pending U.S. Appl. No. 11/918,975.
International Search Report dated Dec. 12, 2006 in co-pending PCT patent application No. PCT/JP2006/321337.
Final Rejection dated Jul. 20, 2011 in co-pending U.S. Appl. No. 12/451,359.
Office Action dated Apr. 20, 2011 in co-pending U.S. Appl. No. 12/083,529.
Office Action mailed Oct. 1, 2013 in co-pending U.S. Appl. No. 12/451,359.
Korean Communication, with English translation, dated Feb. 24, 2014 in co-pending Korean patent application No. 10-2009-7023450.
Final Rejection mailed Mar. 11, 2014 in co-pending U.S. Appl. No. 12/451,359.
Office action mailed Mar. 25, 2016 in co-pending U.S. Appl. No. 13/575,614.
International Search Report mailed May 10, 2011 in co-pending PCT application No. PCT/JP2011/001399.
International Preliminary Report on Patentability issued Oct. 23, 2012 in co-pending PCT application No. PCT/JP2011/001399.
Chinese communication, with English translation, issued Jul. 2, 2013 in co-pending Chinese patent application No. CN 201180013833.6.
Chinese communication, with English translation, issued Feb. 28, 2014 in co-pending Chinese patent application No. 201180013833.6.
Chinese communication, with English translation, issued Jun. 25, 2014 in co-pending Chinese patent application No. CN 201180013833.6.
Japanese communication, with English translation, mailed Oct. 7, 2014 in co-pending Japanese patent application No. JP 2012-505488.
Taiwanese communication, with English translation, dated Nov. 4, 2014 in co-pending Taiwanese patent application No. TW 100108487.
Taiwanese communication, with English translation, dated Jul. 7, 2015 in co-pending Taiwanese patent application No. TW 100108487.
Office action mailed Sep. 28, 2015 in co-pending U.S. Appl. No. 13/575,614.
Paine et al., "Boron Nitride Fillers for Organic Polymer Composites", Polymer Nanocomposites, Chapter 4, pp. 27-38, ACS Symposium Series, vol. 804, 2009.

* cited by examiner

POLYAMIDE RESIN, EPOXY RESIN COMPOSITIONS, AND CURED ARTICLES THEREOF

TECHNICAL FIELD

The present invention relates to a phenolic hydroxyl group-containing aromatic polyamide resin having a high equivalent weight of active hydrogen to epoxy group (that is, a phenolic hydroxyl group content is low), a low ionic impurity content, and a relatively high viscosity, a resin composition containing the same, and a flexible printed wiring board material using the polyamide resin or the resin composition.

BACKGROUND ART

Epoxy resins are cured with various curing agents to provide cured products generally excellent in mechanical properties, water resistance, chemical resistance, heat resistance, and electrical properties, and are therefore used in various fields such as adhesives, paints, laminated plates, molding materials, and casting materials. Among such conventional epoxy resins, bisphenol A epoxy resins are most commonly used. As curing agents for epoxy resins, acid anhydrides and amine-based compounds are known, but in the field of electric and electronic parts, phenol novolac resins are often used from the viewpoint of reliability such as heat resistance. Further, various flame retardants are also used for imparting flame retardancy to cured products. As such flame retardants, bromine-containing compounds such as tetrabromobisphenol A, epoxidation products thereof, and reaction products of tetrabromobisphenol A and bisphenol A epoxy resins are generally known.

As described above, such bromine-containing compounds have excellent ability to impart flame retardancy to resins, but it has been pointed out that there is a possibility that they generate substances causing environmental pollution during disposal or incineration. In addition, there is also a concern about the toxicity of antimony compounds used as flame retardant aids. In recent years, there has been an increasing demand for halogen- and antimony-free epoxy resin compositions with the growing awareness of environmental protection. Meanwhile, epoxy resins cured using a phenol novolac resin as a curing agent are rigid and lack in flexibility while having high reliability. In recent years, there have been developed various electric and electronic parts including, in addition to conventional large packaged parts and plate-shaped parts using rigid substrates containing glass fibers as a base material, molded parts of polyimide films, PET (polyethylene terephthalate) films or flexible sheet-shaped resin substrates. Such molded parts are used for a flexible printed wiring board as a laminated structure bonded to a metal foil or a metal circuit. Such a laminated structure is usually produced by applying an epoxy resin composition in the form of varnish onto a base material such as polyimide or copper foil, removing a solvent, and curing the epoxy resin composition. In this case, a resin to be used is required to have sufficient flexibility and good adhesion to a base material such as polyimide or copper foil. In addition, from the viewpoint of ensuring the reliability of electric and electronic parts, a resin composition to be used is required to have high purity, and a cured product thereof is required to have high heat resistance.

Meanwhile, as an epoxy resin composition intended to improve the brittleness of conventional epoxy resin, Patent Document 2 discloses an epoxy resin composition containing three components, an epoxy resin, a phenol resin, and a phenolic hydroxyl group-containing aromatic polyamide resin, and describes that the epoxy resin composition has toughness and heat resistance. Further, Patent Document 3 describes that an epoxy resin composition containing an epoxy resin and a phenolic hydroxyl group-containing polyamide resin has excellent flame retardancy, and is therefore useful as a material for flexible printed wiring boards. Further, Patent Document 4 discloses a polyamide-containing varnish.

However, in order to produce such a phenolic hydroxyl group-containing polyamide resin, it is necessary to carry out a condensation reaction between a diamine component and a dicarboxylic acid component generally in the presence of a phosphorous acid compound, and therefore phosphorus-based ions such as phosphate ions and phosphite ions (hereinafter, sometimes also referred to as "ionic impurities") remain in the resin. In a case where the resin has a relatively low molecular weight and a low viscosity, it is possible to sufficiently reduce the phosphate ions and the like by washing the resin with water. However, in a case where the molecular weight of the polyamide resin is increased, the viscosity of the polyamide resin is also increased, and therefore it becomes difficult to sufficiently reduce the phosphate ions and the like by only washing the resin with water. This may cause deterioration of electrical properties of electric and electronic parts and the like using the resin.

Patent Document 1: Japanese Patent No. 2969585
Patent Document 2: JP 2000-313787 A
Patent Document 3: WO 2004/048436
Patent Document 4: WO 02/34850

DISCLOSURE OF THE INVENTION

Problems to be Solved by the Invention

An object of the present invention is to provide a phenolic hydroxyl group-containing aromatic polyamide resin whose ionic impurity content is low even when its viscosity is relatively high and which has improved adhesion properties as well as excellent properties in conventional phenolic hydroxyl group-containing aromatic polyamide resins, such as excellent flame retardancy and the ability to allow cured products using the resin to have excellent heat resistance and flexibility.

Means for Solving the Problems

The present inventors have found that, contrary to the disclosure of the conventional art, even when the viscosity of the phenolic hydroxyl group-containing polyamide resin is relatively high, the ionic impurity content thereof can be reduced by lowering the ratio of hydroxyl groups contained therein, and that an epoxy resin composition using the polyamide resin improves adhesion properties and flexibility and flame retardancy of the cured products can be kept. These findings have led to the completion of the present invention.

More specifically, the present invention relates to the following:

1. A phenolic hydroxyl group-containing aromatic polyamide resin having a structure represented by the following formula (1):

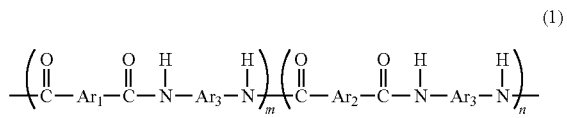

(1)

wherein m and n are average values satisfying the formula: $0.005 \leq n/(m+n) < 0.05$, m+n is a positive value of 2 to 200, $Ar_1$ is a bivalent aromatic group, $Ar_2$ is a phenolic hydroxyl group-containing bivalent aromatic group, and $Ar_3$ is a bivalent aromatic group;

2. A phenolic hydroxyl group-containing aromatic polyamide resin having a structure represented by the following formula (5):

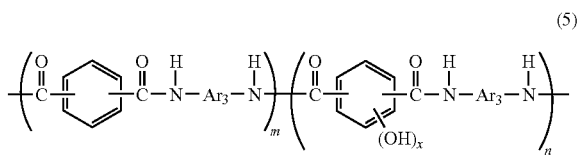

(5)

wherein $Ar_3$, n, and m are the same as those defined in the formula (1), and x represents the average number of substituents and is a positive value of 1 to 4;

3. The phenolic hydroxyl group-containing aromatic polyamide resin according to the above 1, wherein $Ar_3$ is a group represented by the following formula (4):

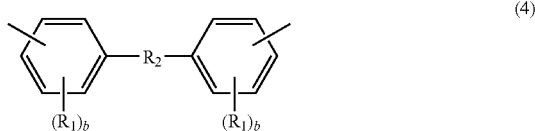

(4)

wherein $R_1$ is a hydrogen atom, a fluorine atom, a hydroxyl group, or a C1 to C6 substituent which may contain O, S, P, F, or Si, $R_2$ is a direct bond or a bond containing 0 to 6 carbon atoms which may contain O, N, S, P, F, or Si, and b represents the average number of substituents and is a positive value of 0 to 4;

4. The phenolic hydroxyl group-containing aromatic polyamide resin according to the above 3, wherein in the formula (4), $R_1$ is a hydrogen atom or a C1 to C3 alkyl group, $R_2$ is a direct bond or a group represented by —O—, —$SO_2$—, —CO—, or —$(CH_2)_{1-3}$—, and b is a positive value of 1 to 2;

5. The phenolic hydroxyl group-containing aromatic polyamide resin according to the above 1, wherein n/(m+n) satisfies the following formula: $0.005 \leq n/(m+n) < 0.04$;

6. The phenolic hydroxyl group-containing aromatic polyamide resin according to the above 1, which has an equivalent weight of active hydrogen to epoxy group of 2,000 to 5,000 g/eq;

7. The phenolic hydroxyl group-containing aromatic polyamide resin according to the above 1, wherein $Ar_3$ is represented by the following formula:

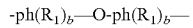

(wherein ph is a phenylene group, $R_1$ represents a substituent on the phenylene group and is a hydrogen atom, a fluorine atom, a hydroxyl group, or a C1 to C6 alkyl group, and b represents the average number of substituents and is 0 to 4), the polyamide resin having an equivalent weight of active hydrogen to epoxy group of 2,000 to 5,000 g/eq;

8. The phenolic hydroxyl group-containing aromatic polyamide resin according to the above 5, which has an intrinsic viscosity (as measured at a concentration of 0.5 g/dl in N,N-dimethylacetamide solution at 30° C.) of 0.3 to 4.0 dl/g;

9. A resin composition including the following components: (1) the phenolic hydroxyl group-containing aromatic polyamide resin according to any one of the above 1 to 5; and (2) any one or both of an organic solvent and an epoxy resin;

10. The resin composition according to the above 9, wherein the component (2) is an organic solvent;

11. The epoxy resin composition according to the above 9, wherein the component (2) is only an epoxy resin or both of an organic solvent and an epoxy resin;

12. A film obtained by forming the epoxy resin composition according to the above 11 into a sheet shape;

13. A cured product of the epoxy resin composition according to the above 11;

14. A cured product of the film according to the above 12;

15. An adhesive sheet for flexible printed wiring boards, including: a layer composed of the epoxy resin composition according to the above 11, a layer composed of a film obtained by forming the epoxy resin composition according to the above 11 into a sheet shape, or a layer composed of a cured product thereof;

16. A reinforcing plate for flexible printed wiring boards, including: a layer composed of the epoxy resin composition according to the above 11, a layer composed of a film obtained by forming the epoxy resin composition according to the above 11 into a sheet shape, or a layer composed of a cured product thereof;

17. A coverlay for flexible printed wiring boards, including: a layer composed of the epoxy resin composition according to the above 11, a layer composed of a film obtained by forming the epoxy resin composition according to the above 11 into a sheet shape, or a layer composed of a cured product thereof;

18. Single- or double-sided metal-clad resin laminate characterized in that a metal foil or a polyimide-clad metal foil is bonded to one side or both sides of a layer composed of the epoxy resin composition according to the above 11, or of a layer composed of a film obtained by forming the epoxy resin composition according to the above 11 into a sheet shape, or of a layer composed of a cured product thereof so that one surface of the metal foil or the polyimide film surface of the polyimide-clad metal foil is brought into contact with the surface(s) of the layer; and 19. A flexible printed wiring board characterized by comprising: a layer composed of the epoxy resin composition according to the above 11, a layer composed of a film obtained by forming the epoxy resin composition according to the above 11 into a sheet shape, or a layer composed of a cured product thereof.

Effect of the Invention

The phenolic hydroxyl group-containing aromatic polyamide resin according to the present invention and a resin composition or epoxy resin composition containing the polyamide resin have sufficient flexibility even when they are formed into a thin film, and are highly pure because the ionic impurity content of the phenolic hydroxyl group-containing aromatic polyamide resin is low. Therefore, there is no fear that performance deterioration or the like occurs, when said aromatic polyamide resin, resin composition or epoxy resin composition is used in electric and electronic parts, and such electric and electronic parts have excellent electrical properties. Further, the epoxy resin composition has more improved adhesion properties. Further, a sheet-shaped film of the epoxy resin composition and a cured product thereof have excellent flame retardancy, heat resistance, and adhesion properties as well as excellent flexibility and electrical properties, and therefore they can be widely used for producing flexible printed wiring boards and are very useful in the field of electrical materials such as electrical substrates.

BEST MODE FOR CARRYING OUT THE INVENTION

A phenolic hydroxyl group-containing aromatic polyamide resin according to the present invention (hereinafter, sometimes also referred to as a "polyamide according to the present invention" or a "polyamide resin according to the present invention") is not particularly limited as long as it has a structure represented by the following formula (1):

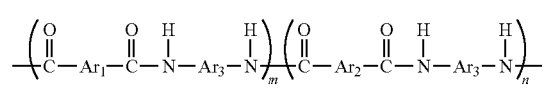

(1)

wherein m and n are average values satisfying the following formula: $0.005 \leq n/(m+n) < 0.05$, preferably $0.005 \leq n/(m+n) < 0.04$, more preferably $0.005 \leq n/(m+n) \leq 0.03$ (where in some cases, the lower limit may be 0.01 or more), m+n is a positive value of 2 to 200, preferably 20 to 100, more preferably 30 to 80, $Ar_1$ is a bivalent aromatic group, $Ar_2$ is a phenolic hydroxyl group-containing bivalent aromatic group, and $Ar_3$ is a bivalent aromatic group.

It is to be noted that in this specification, the value of "m+n" (average polymerization degree) is a theoretical average polymerization degree calculated from a feed ratio. The theoretical average polymerization degree calculated from a feed ratio refers to the average number of molecules polymerized before the ends of a resultant polymer are blocked, which can be determined by calculation based on a feed ratio of monomers used as raw materials. However, in some cases, the average polymerization degree of the polyamide resin according to the present invention may be estimated by measuring the intrinsic viscosity of the polyamide resin according to the present invention and by referring to the previously measured intrinsic viscosities of some polyamide resins experimentally prepared by changing a feed ratio conversely.

Preferred examples of the polyamide resin according to the present invention include those having a segment represented by the following formula (2):

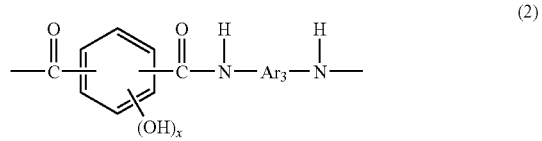

(2)

wherein $Ar_3$ is the same as that defined in the formula (1), and x represents the average number of substituents and is a positive value of 1 to 4. It is preferred that the segment represented by "( )n" in the formula (1) is the segment represented by the formula (2).

Preferable —$Ar_3$— groups in the repeating units in the formula (1) and the segment represented by the formula (2) include at least one of aromatic residues represented by the following formula (3):

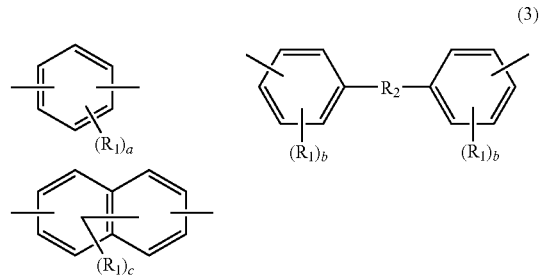

(3)

wherein $R_1$ is a hydrogen atom, a fluorine atom, a hydroxyl group, or a C1 to C6 substituent which may contain O, S, P, F, or Si, $R_2$ is a direct bond or a bond containing 0 to 6 carbon atoms which may contain O, N, S, P, F, or Si; a, b and c each represent the average number of substituents; a and b are each a positive value of 0 to 4; and c is a positive value of 0 to 6. Among these aromatic residues, one represented by the following formula (4) is preferred:

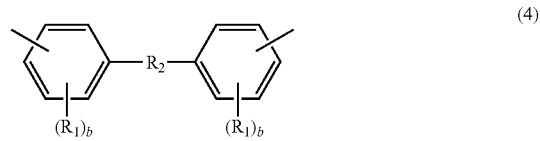

(4)

wherein $R_1$, $R_2$, and b are the same as those defined in the formula (3).

Preferred examples of $R_1$ in the formula (4) include: a hydrogen atom; a hydroxyl group; chain alkyl groups, preferably C1 to C6 alkyl groups such as a methyl group, an ethyl group, a propyl group, a butyl group, a pentyl group, and a hexyl group; and cyclic alkyl groups, preferably C4 to C6 cyclic alkyl groups such as a cyclobutyl group, a cyclopentyl group, and a cyclohexyl group. In a case where two or more $R_1$ is exist in the formula (4), they may be the same or different from each other, and are preferably all the same. $R_1$ is more preferably a hydrogen atom or an alkyl group having 1 to 3 carbon atoms, and is most preferably a hydrogen atom. In a case where $R_1$ is a substituent other than a hydrogen atom, the substituent $R_1$ is preferably in the meta-position to the position of $R_2$ bonded to the benzene ring. Preferred examples of $R_2$ in the formula (4) include a direct bond, —O—, —$SO_2$—, —CO—, —$(CH_2)_{1-6}$—, —$C(CH_3)_2$—, and —$C(CF_3)_2$—, more preferably, —O—, —$SO_2$—, and —$(CH_2)_{1-3}$—, and further preferably —O—. It is to be noted that in a case where $Ar_3$ in the formula (1) is the formula (4), —NH— groups are preferably configured to be bonded to the 3,4'-positions or the 4-,4'-positions in the formula (4).

The phenolic hydroxyl group-containing polyamide resin according to the present invention is not particularly limited as long as it contains a phenolic hydroxyl group-containing segment represented by the formula (2) in an amount of 0.05 mol % or more but less than 0.5 mol %, preferably 0.05 mol % or more but less than 0.4 mol % of the total amount of all the segments contained therein, even when it contains a segment having an elastomer structure such as a butadiene moiety or a butadiene-acrylonitrile copolymer moiety or another structure in addition to the phenolic hydroxyl group-containing segment represented by the formula (2). Among them, an aromatic residue- and phenolic hydroxyl group-containing aromatic polyamide resin represented by the following formula (5) is preferred:

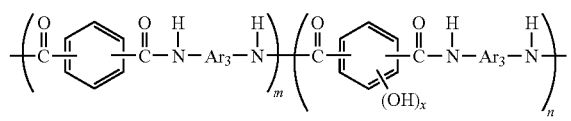

(5)

wherein $Ar_3$, n, and m are the same as those defined in the formula (1), and x is the same as that defined in the formula (2).

Preferred examples of $Ar_3$ in the formula (5) are same as those described above. In the formula (5), —CO— groups are preferably bonded to the 1,3-positions of the benzene ring having a phenolic hydroxyl group and of the benzene ring having no phenolic hydroxyl group.

The polyamide resin represented by the formula (1) preferably has a 1,3-phenylene group as $Ar_1$ and a 5-hydroxy-substituted 1,3-phenylene group as $Ar_2$. More preferably, the polyamide resin represented by the formula (1) has, in addition to such $Ar_1$ and $Ar_2$, an aromatic residue represented by the formula (4) mentioned above as $Ar_3$, and particularly preferably, the formula (4) is -ph-O-ph- (where -ph- is a phenylene group).

The polyamide resin according to the present invention is characterized by having a higher equivalent weight of active hydrogen to epoxy group than conventional phenolic hydroxyl group-containing aromatic polyamide resins. The equivalent weight of active hydrogen to epoxy group of the polyamide resin calculated from the amounts of raw materials fed is 1,700 g/eq or more, preferably 2,000 g/eq or more, more preferably 2,500 g/eq or more, and the upper limit thereof is 20,000 g/eq or less, preferably 10,000 g/eq or less, more preferably 5,000 g/eq or less. Most preferably, the polyamide resin has an equivalent weight of active hydrogen to epoxy group of 2,000 to 5,000 g/eq.

The phenolic hydroxyl group-containing aromatic polyamide resin according to the present invention is usually obtained by carrying out, in the presence of a condensing agent, a condensation reaction of a phenolic hydroxyl group-containing dicarboxylic acid and another aromatic dicarboxylic acid (that is, an aromatic dicarboxylic acid not containing a phenolic hydroxyl group) with an aromatic diamine in such a ratio that a polyamide resin satisfying n/(m+n) defined in the formula (1) can be obtained.

The polyamide resin obtained by the condensation reaction has at its each end, either a segment represented by "( )$_m$" or a segment represented by "( )$_n$" and both the end segments of the polyamide resin may be the same or different. It can be considered that in most cases, the polyamide according to the present invention has a segment represented by "( )$_m$" at its each end. The both ends of the polyamide resin are either both amino groups, both carboxyl groups, or one is an amino group and the other is a carboxyl group. In a case where both ends of the polyamide resin are amino groups, one molecule of the aromatic diamine is bonded to the carbonyl group positioned at the left-hand side end of the segment represented by "( )$_m$" in the formula (1) to provide an amino group at the left-hand side end, and a hydrogen atom is bonded to the right-hand side end of the segment represented by "( )$_n$" to provide an amino group at the left-hand side end. In a case where both ends of the polyamide resin are carboxyl groups, one molecule of the aromatic dicarboxylic acid is bonded to the —NH— group in the segment represented by "( )$_n$" in the formula (1) to provide a carboxyl group at the right-hand side end, and a hydroxyl group is bonded to the end carbonyl group of the segment represented by "( )$_m$" to provide an carboxyl group at the left-hand side end. In a case where one end of the polyamide resin is an amino group and the other end is a carboxyl group, a hydroxyl group is bonded to the carbonyl group positioned at the left-hand side end of the segment represented by "( )$_m$" in the formula (1) to provide a carboxyl group, and a hydrogen atom is bonded to the —NH— group in the segment represented by "( )$_n$" to provide an amino group. The polyamide resin according to the present invention preferably has amino groups at its both ends. Such a polyamide resin having amino groups at its both ends can be obtained by using the aromatic diamine component in excess relative to the aromatic dicarboxylic acid component.

The polyamide resin according to the present invention having an elastomer structure can be obtained by reacting, after the above-described condensation reaction, the condensation product with an elastomer having carboxylic acids or amines at its both ends.

The polyamide resin according to the present invention can be synthesized by applying, for example, a method described in Japanese Patent No. 2969585. More specifically, the polyamide resin according to the present invention can be obtained by polycondensing an aromatic diamine component and an aromatic dicarboxylic acid component (that is, a phenolic hydroxyl group-containing aromatic dicarboxylic acid and an aromatic dicarboxylic acid not containing a phenolic hydroxyl group) in the presence of a phosphite ester and a pyridine derivative. According to this production method, it is possible to easily produce a linear aromatic polyamide resin without the necessity to protect phenolic hydroxyl groups as functional groups and, in addition, without causing reactions between a phenolic hydroxyl group and other reactive groups (e.g., a carboxyl group and an amino group). Further, this method has an advantage that the polycondensation reaction does not require high temperature, that is, the reaction can be carried out at a temperature of about 150° C. or less. A preferred temperature of the polycondensation reaction varies depending on the kinds of compounds used as raw materials etc., and therefore cannot be definitely described. However, in a case where a mixture of 5-hydroxyisophthalic acid and isophthalic acid is used as a dicarboxylic acid component and 3,4'-diaminodiphenylether is used as a diamine component, a polycondensation reaction between them can be carried out at, for example, 80 to 120° C., preferably 80° C. or higher but less than 100° C. The time of the polycondensation reaction varies depending on the desired polymerization degree of the resin etc., but is preferably 5 hours or more to 20 hours or less to obtain a resin having a relatively high molecular weight, that is, a resin having m+n of 5 or more, preferably more than 10.

Hereinbelow, the method for producing an aromatic polyamide copolymer to be used in the present invention will be described in more detail. Examples of the aromatic diamine to be used for producing a phenolic hydroxyl group-containing aromatic polyamide resin include: phenylenediamine derivatives such as m-phenylenediamine, p-phenylenediamine, and m-tolylenediamine; diaminodiphenyl ether derivatives such as 4,4'-diaminodiphenyl ether, 3,3'-dimethyl-4,4'-diaminodiphenyl ether, 3,4'-diaminodiphenyl ether; diaminodiphenyl thioether derivatives such as 4,4'-diaminodiphenyl thioether, 3,3'-dimethyl-4,4'-diaminodiphenyl thioether, 3,3'-diethoxy-4,4'-diaminodiphenyl thioether, 3,3'-diaminodiphenyl thioether, and 3,3'-dimethoxy-4,4'-diaminodiphenyl thioether; diaminobenzophenone derivatives such as 4,4'-diaminobenzophenone and 3,3'-dimethyl-4,4'-diaminobenzophenone; diaminodiphenylsulfone derivatives such as 4,4'-diaminodiphenylsulfoxide and 4,4'-diaminodiphenylsulfone; benzidine derivatives such as benzidine, 3,3'-dimethylbenzidine, 3,3'-dimethoxybenzidine, and 3,3'-diaminobiphenyl; xylylenediamine derivatives such as p-xylylenediamine, m-xylylenediamine, and o-xylylenediamine; and diaminodiphenylmethane derivatives such as 4,4'-diaminodiphenylmethane, 3,3'-diaminodiphenylmethane, 4,4'-diamino-3,3'-dimethyldiphenylmethane, 4,4'-diamino-3,3'-diethyldiphenylmethane, 4,4'-diamino-3,3',5,5'-tetramethyldiphenylmethane, and 4,4'-diamino-3,3',5,5'-tetraethyldiphenylmethane. Among these aromatic diamines, phenylenediamine derivatives, diaminodiphenylmethane derivatives, and diaminodiphenylether derivatives are preferred, and diaminodiphenylmethane derivatives (that is, compounds having a structure represented by the formula (4) wherein $R_2$ is —$CH_2$—) and diaminodiphenylether derivatives (that is, compounds having a structure represented by the formula (4) wherein $R_2$ is —O—) are more preferred, and 3,4'-diaminodiphenylether or 4,4'-diaminodiphenylether is particularly preferred from the viewpoint of the solvent solubility and flame retardancy of a resultant polymer.

The phenolic hydroxyl group-containing aromatic dicarboxylic acid to be used in the present invention is not particularly limited as long as its aromatic ring has two carboxyl groups and at least one hydroxyl group, and examples thereof include dicarboxylic acids having one hydroxyl group and two carboxyl groups on the benzene ring, such as 5-hydroxyisophthalic acid, 4-hydroxyisophthalic acid, 2-hydroxyisophthalic acid, 3-hydroxyisophthalic acid, and 2-hydroxyterephthalic acid. Among these phenolic hydroxyl group-containing aromatic dicarboxylic acids, 5-hydroxyisophthalic acid is preferred from the viewpoints of the solvent solubility and purity of a resultant polymer, the electrical properties and adhesiveness to metal foil and polyimide of an epoxy resin composition using the polymer, and the like. The phenolic hydroxyl group-containing aromatic dicarboxylic acid is used in an amount of 0.5 mol % or more but less than 5 mol %, preferably 0.5 mol % or more but less than 4 mol % relative to the total amount of the dicarboxylic acid component. This feed ratio determines the value of n/(m+n) in the formula (1).

Examples of the aromatic dicarboxylic acid not containing said phenolic hydroxyl group to be used for producing a polyamide resin in the present invention include phthalic acid, isophthalic acid, terephthalic acid, 4,4'-oxydibenzoic acid, 4,4'-biphenyldicarboxylic acid, 3,3',-methylenedibenzoic acid, 4,4'-methylenedibenzoic acid, 4,4'-thiodibenzoic acid, 3,3'-carbonyldibenzoic acid, 4,4'-carbonyldibenzoic acid, 4,4'-sulfonyldibenzoic acid, 1,5-naphthalenedicarboxylic acid, 1,4-naphthalenedicarboxylic acid, 2,6-naphthalenedicarboxylic acid, and 1,2-naphthalenedicarboxylic acid. Among these aromatic dicarboxylic acids, isophthalic acid is preferred.

Examples of the phosphite ester to be used as a condensing agent for the above-described condensation reaction include, but are not limited to, triphenyl phosphite, diphenyl phosphite, tri-o-tolyl phosphite, di-o-tolyl phosphite, tri-m-tolyl phosphite, tri-p-tolyl phosphite, di-p-tolyl phosphite, di-p-chlorophenyl phosphite, tri-p-chlorophenyl phosphite, and di-p-chlorophenyl phosphite.

Examples of the pyridine derivative to be used together with the phosphite ester include pyridine, 2-picoline, 3-picoline, 4-picoline, and 2,4-lutidine.

The condensing agent to be used for producing a phenolic hydroxyl group-containing aromatic polyamide resin to be used in the present invention is composed of the phosphite ester and the pyridine derivative, and the pyridine derivative is generally added to an organic solvent when used. It is preferred that the organic solvent does not substantially react with the phosphite ester and can satisfactorily dissolve not only the aromatic diamine and the dicarboxylic acids but also a phenolic hydroxyl group-containing aromatic polyamide resin as a reaction product. Examples of such an organic solvent include, in addition to amide-based solvents such as N-methyl pyrrolidone and dimethylacetamide, toluene, methyl ethyl ketone, and mixed solvents of one or more of them and one or more of the amide-based solvents. Among these organic solvents, N-methyl-2-pyrrolidone is preferred. The pyridine derivative is usually used in an amount of about 5 to 30 wt % relative to the total amount of the pyridine derivative and the organic solvent.

Further, in order to obtain a phenolic hydroxyl group-containing aromatic polyamide resin having a high polymerization degree, an inorganic salt such as lithium chloride or calcium chloride is preferably added in addition to the phosphite ester and the pyridine derivative. In this case, a reaction temperature is made slightly lower, and is therefore preferably about 110° C. or lower, more preferably about 100° C. or lower.

Hereinbelow, the method for producing a phenolic hydroxyl group-containing aromatic polyamide resin according to the present invention will be described more specifically. First, a phosphite ester is added to a mixed solvent of said pyridine derivative and an organic solvent. Then, an aromatic dicarboxylic acid component and an aromatic diamine component are added thereto in such a ratio that the amount of the aromatic diamine component is 0.5 to 2 moles, preferably 1 to 2 moles, more preferably more than 1 mol but 2 moles or less, furthermore preferably 1.01 to 1.5 moles per mole of the aromatic dicarboxylic acid component, and then the thus obtained mixture is heated in an atmosphere of an inert gas such as nitrogen while being stirred. After the completion of reaction, a poor solvent such as water, methanol, or hexane is added to a reaction mixture, or a reaction mixture is added to a poor solvent to separate a generated polymer. The separated polymer is purified by a reprecipitation method to remove by-products and inorganic salts from it. In this way, a phenolic hydroxyl group-containing aromatic polyamide resin having a structure represented by the formula (1) is obtained.

It is to be noted that the aromatic diamine component is preferably used in excess relative to the aromatic dicarboxylic acid component (e.g., an excess of 1 to 5 mol % or more is preferred) from the viewpoint of protecting phenolic hydroxyl groups.

A preferred method for obtaining a polyamide resin according to the present invention having a lower ionic impurity content is as follows. The precipitation of a resin from the resin solution (including the reaction mixture) using a poor solvent, preferably water, more preferably ion-exchanged water and the dissolution of the precipitated resin in a solvent, that is, in a solvent which can dissolve the resin (e.g., any one of the solvents which will be mentioned later in the paragraph of a resin composition, preferably an amide-based solvent, more preferably N,N-dimethylformamide) are repeated, and then, if necessary, the resin is finally purified using methanol. More specifically, ion-exchanged water is added to the reaction mixture obtained in such a manner as described above until a resin is precipitated, and then the upper liquid phase is removed. Then, N,N-dimethylformamide is added to dissolve the resin, and then ion-exchanged water is again added to precipitate the resin. The upper liquid phase is removed, and the precipitated resin is again dissolved in N,N-dimethylformamide, and then the resin is precipitated using ion-exchanged water. Such a series of dissolution and precipitation steps is repeated about 2 to 10 times, preferably about 3 to 7 times if necessary, and then water is removed under a reduced pressure to obtain a polyamide resin according to the present invention in the form of a polyamide resin solution (resin composition). The polyamide resin according to the present invention having a lower ionic impurity content can be isolated from the resin solution in the following manner. The resin composition is charged into ion-exchanged water or methanol to precipitate a resin, the resin is separated by filtration, and if necessary, the resin is purified by washing with methanol and reflux with methanol. If necessary, the thus obtained resin is separated by filtration and dried.

The amount of the phosphite ester to be added as a condensing agent in the production method described above is usually equimolar or more to, preferably about 30 times moles or less as carboxyl group. Use of more than 30 moles of the phosphite ester per mole of carboxyl group is not efficient. In a case where a phosphite triester is used, a phosphite diester is produced as a by-product and also functions as a condensing agent, and therefore the amount of the phosphite triester to be used may be about 80 mol % relative to the amount of carboxyl groups. The amount of the pyridine derivative is preferably equimolar or more to per mole of carboxyl group. In reality, the pyridine derivative is often used in large excess because it is also served as a reaction solvent. The amount of a mixture of the pyridine derivative and an organic solvent to be used is preferably in the range of 5 to 30 parts by weight per 100 parts by weight of a phenolic hydroxyl group-containing aromatic polyamide resin theoretically obtainable. A reaction temperature is usually about in the range of 60 to 180° C., preferably about in the range of 70 to 130° C., more preferably about in the range of 80 to 110° C. A reaction time is greatly influenced by the reaction temperature, but in any cases, a reaction system is preferably stirred until the viscosity (that is, polymerization degree) of a reaction mixture reaches its highest value. Therefore, a reaction time is usually in the range of several minutes to 20 hours. By reacting 3,4'-diaminodiphenylether with 5-hydroxyisophthalic acid and isophthalic acid under the above-described preferred reaction conditions in such a manner that the amount of 3,4'-diaminodiphenylether used is equimolar or slightly excessive relative to the total amount of 5-hydroxyisophthalic acid and isophthalic acid used, it is possible to obtain a phenolic hydroxyl group-containing aromatic polyamide resin having a most preferred average polymerization degree (m+n) of about 2 to 100.

The intrinsic viscosity of the phenolic hydroxyl group-containing aromatic polyamide resin having a preferred average polymerization degree (as measured at a concentration of 0.5 g/dl in N,N-dimethylacetamide at 30° C.) is in the range of 0.1 to 4.0 dl/g, preferably 0.3 dl/g or more, more preferably 0.35 dl/g or more. The upper limit of the intrinsic viscosity is preferably 3.0 dl/g or less, more preferably 2.0 dl/g or less, even more preferably 0.8 dl/g or less. In general, the intrinsic viscosity is referred for judging whether the polyamide resin has a favorable average polymerization degree. If the intrinsic viscosity of the polyamide resin is less than 0.1 dl/g, it is not preferable because the ability of the polyamide resin to form a film is poor, and the polyamide resin cannot sufficiently exhibit properties inherent in aromatic polyamide resins. On the other hand, if the intrinsic viscosity of the polyamide resin exceeds 4.0 dl/g, problems that the solvent solubility of the polyamide resin is poor and the molding processability of the polyamide resin is deteriorated are caused due to its too high polymerization degree.

An example of a method for easily controlling the polymerization degree of the phenolic hydroxyl group-containing aromatic polyamide resin includes a method in which one of the aromatic diamine and the aromatic dicarboxylic acid component is used in excess. However, in the case of the present invention, it is preferred that the amount of the aromatic diamine used is almost equimolar or slightly excessive (e.g., an excess of about 0 to 20 mol %, preferably an excess of about 1 to 15 mol %) relative to the amount of the aromatic dicarboxylic acid component to obtain a phenolic hydroxyl group-containing aromatic polyamide resin having a relatively high polymerization degree.

Preferred specific examples of the elastomer having carboxylic acids or amines at both ends to be used for introducing an elastomer into the polyamide resin according to the present invention include polybutadiene having carboxylic acids at both ends (e.g., CTB manufactured by Ube Industries. Ltd.) and a butadiene-acrylonitrile copolymer having carboxylic acids at both ends (e.g., CTBN manufactured by Ube Industries. Ltd.). The elastomer is used in such an amount that the amount of amino groups or carboxyl groups of the elastomer is one or more equivalents, preferably 1 to 1.5 equivalents per equivalent of terminal carboxyl group or amino group in the obtained polyamide.

A resin composition according to the present invention is not particularly limited as long as it contains the phenolic hydroxyl group-containing aromatic polyamide according to the present invention. That is, the resin composition according to the present invention includes any resin composition containing the polyamide resin according to the present invention and one or more other components. A preferred example of the resin composition includes a resin solution obtained by dissolving the polyamide resin in a solvent, and an epoxy resin composition containing the polyamide resin and an epoxy resin (hereinafter, also referred to as an "epoxy resin composition according to the present invention"). The resin composition according to the present invention preferably contains: (1) the polyamide resin according to the present invention; and (2) one or both of a solvent and an epoxy resin. In this case, the amount of the polyamide resin according to the present invention is in the range of 10 to 97 wt % relative to the total amount of (1) and (2), and the amount of one or both of a solvent and an epoxy resin is in the range of 3 to 90 wt % relative to the total amount of (1) and (2).

The preferable resin solution is obtained by repeating a series of dissolution and precipitation steps in the above-described resin purification process and then further dissolving a purified resin in a solvent. Examples of the solvent include γ-butyrolactones; amide-based solvents such as N-methylpyrrolidone (NMP), N,N-dimethylformamide (DMF), N,N-dimethylacetamide, and N,N-dimethylimidazolidinone; sulfones such as tetramethylene sulfone; ether-based solvents such as diethylene glycol dimethyl ether, diethylene glycol diethyl ether, propylene glycol, propylene glycol monomethyl ether, propylene glycol monomethyl ether monoacetate, and propylene glycol monobutyl ether; ketone-based solvents such as methyl ethyl ketone, methyl isobutyl ketone, cyclopentanone, and cyclohexanone; and aromatic solvents such as toluene and xylene. Among these solvents, amide-based solvents are preferred, and N,N-dimethylacetamide is more preferred. The resin content of the obtained resin solution is usually in the range of 10 to 80 wt %, preferably in the range of 20 to 70 wt %. Alternatively, the resin composition according to the present invention whose resin content is in the range of about 15 to 50 wt %, for example, a resin solution obtained by appropriately repeating the precipitation of a generated resin in the reaction mixture described above and the dissolution of the resin and then removing water may be directly used for producing an epoxy resin composition.

The epoxy resin composition according to the present invention contains the polyamide resin according to the present invention or the resin solution according to the present invention, and en epoxy resin. The epoxy resin is not particularly limited as long as it has an aromatic ring such as a benzene ring, a biphenyl ring, or a naphthalene ring and two or more epoxy groups in one molecule. Specific examples of such an epoxy resin include, but are not limited to: novolac epoxy resins such as phenol (e.g., phenol, cresol, or naphthol) novolac epoxy resins, xylylene skeleton-containing phenol novolac epoxy resins, and biphenyl skeleton-containing novolac epoxy resins; bisphenol epoxy resins such as bisphenol A epoxy resins and bisphenol F epoxy resins; and tetramethylbiphenol epoxy resins. Among these epoxy resins, novolac epoxy resins and bisphenol epoxy resins and the like are preferred, and biphenyl skeleton-containing novolac epoxy resins such as NC-3000 (trade name: manufactured by Nippon Kayaku Co., Ltd.) and the like are more preferred.

The polyamide resin according to the present invention contained in the epoxy resin composition according to the present invention functions as a curing agent. The epoxy resin composition according to the present invention may contain one or more other curing agents used together with the polyamide resin according to the present invention. Specific examples of one or more other curing agents used together with the polyamide resin according to the present invention include, but are not limited to, diaminodiphenylmethane, diethylenetriamine, triethylenetetramine, diaminodiphenylsulfone, isophoronediamine, dicyandiamide, a polyamide resin synthesized from linoleic acid dimer and ethylenediamine, phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, phenol novolac, triphenylmethane, and modified products thereof, imidazole, $BF_3$-amine complex, and guanidine derivatives. In a case where the polyamide resin according to the present invention is used together with one or more other curing agents, the amount of the polyamide resin is usually in the range of 20 to 100 wt %, preferably in the range of 30 to 100 wt % relative to the total amount of the polyamide resin and one or more other curing agents. It is to be noted that even in a case where only the polyamide resin according to the present invention is used as a curing agent, a favorable result can be usually obtained.

The amount of the curing agent contained in the epoxy resin composition according to the present invention varies depending on the kind of epoxy resin used etc., and therefore cannot be definitely described. However, in a certain case, the active hydrogen equivalent of the curing agent is preferably 0.7 to 1.2 per equivalent of epoxy group in the epoxy resin. In some cases, the active hydrogen equivalent of the curing agent is preferably 0.7 to 4, more preferably 1 to 3 per equivalent of epoxy group in the epoxy resin. The active hydrogen equivalent weight of the phenolic hydroxyl group-containing aromatic polyamide resin according to the present invention can be calculated from the amount of a phenolic hydroxyl group-containing aromatic dicarboxylic acid and the amount of an aromatic diamine component fed for condensation reaction.

Further, a curing accelerator may also be used together with the curing agent. Usually, a curing accelerator is preferably used together with the curing agent. Specific examples of the curing accelerator include: imidazoles such as 2-methylimidazole, 2-ethylimidazole, 2-ethyl-4-methylimidazole, 2-phenyl-4,5-dihydroxymethylimidazole, and 2-phenyl-4-methyl-5-hydroxymethylimidazole; tertiary amines such as 2-(dimethylaminomethyl)phenol and 1,8-diaza-bicyclo(5,4,0)undecene-7; phosphines such as triphenylphosphine; and metal compounds such as tin octylate. Among these curing accelerators, imidazoles are preferred, and 2-phenyl-4,5-dihydroxymethylimidazole, 2-phenyl-4-methyl-5-hydroxymethylimidazole and the like are more preferred. If necessary, the curing accelerator is used in an amount of, in some cases, 0.1 to 5.0 parts by weight, usually 1 to 50 parts by weight, preferably 2 to 30 parts by weight per 100 parts by weight of the epoxy resin.

If necessary, the epoxy resin composition according to the present invention may contain an inorganic filler. Specific examples of the inorganic filler include silica, alumina, talc, and glass staple fibers. The amount of the inorganic filler contained in the epoxy resin composition according to the present invention is 0 to 90 wt %. If necessary, the epoxy resin composition according to the present invention may further contain one or more of various compounding agents such as silane coupling agents, releasing agents (e.g., stearic acid, palmitic acid, zinc stearate, and calcium stearate), and pigments.

The epoxy resin composition according to the present invention can be obtained by uniformly mixing the above-described components. The epoxy resin composition according to the present invention containing no solvent may be directly used depending on its purpose of use. However, the epoxy resin composition according to the present invention containing a solvent is usually preferred. The solvent-containing epoxy resin composition according to the present invention is basically composed of the polyamide resin according to the present invention, an epoxy resin, and a solvent. The total amount of the polyamide resin and the epoxy resin is usually 10 to 60 wt %, preferably about 20 to 50 wt % relative to the total amount of the three components (that is, the polyamide resin, the epoxy resin, and the solvent), and the rest is the solvent. In a case where a curing accelerator is used, the amount of the curing accelerator to be added is usually in the range of about 0 to 5 wt %, preferably in the range of about 0.3 to 3 wt % relative to the total amount of the polyamide resin and the epoxy resin. If necessary, said inorganic filler and/or said compounding agent are/is added to the epoxy resin composition, and they are uniformly mixed by stirring or another method. In a case where the epoxy resin composition does not contain a solvent or the viscosity of the epoxy resin composition is high even when it contains a solvent so that it is difficult to make the epoxy resin composition uniform by stirring, the epoxy resin composition can be sufficiently mixed by using, for example, an extruder, a kneader, or a roller until the mixture becomes uniform. For example, in a case where an epoxy resin, a curing agent, and, if necessary, a curing accelerator, an inorganic filler, and a compounding agent are mixed, they can be sufficiently mixed using an extruder, a kneader, a roller, or the like until the mixture becomes uniform.

A cured product of the epoxy resin composition according to the present invention can be easily obtained by a method similar to a conventionally-known method. For example, a cured product according to the present invention can be obtained by sufficiently mixing an epoxy resin, the curing agent, and, if necessary, a curing accelerator, an inorganic filler, and a compounding agent using an extruder, a kneader, a roller, or the like until the mixture becomes uniform, molding the thus obtained epoxy resin composition by melt casting, transfer molding, injection molding, or compression molding, and heating the thus obtained molded product at 80 to 200° C. for 2 to 10 hours.

The epoxy resin composition according to the present invention can be formed into a sheet-shaped film. The sheet-shaped film is preferably formed from the epoxy resin composition according to the present invention containing a solvent. The film can be heated in such a manner as described above to obtain a cured product. Examples of the solvent contained in the epoxy resin composition according to the present invention include γ-butyrolactones; amide-based solvents such as N-methylpyrrolidone (NMP), N,N-dimethylformamide (DMF), N,N-dimethylacetamide, and N,N-dimethylimidazolidinone; sulfones such as tetramethylene sulfone; ether-based solvents such as diethylene glycol dimethyl ether, diethylene glycol diethyl ether, propylene glycol, propylene glycol monomethyl ether, propylene glycol monomethyl ether monoacetate, and propylene glycol monobutyl ether; ketone-based solvents such as methyl ethyl ketone, methyl isobutyl ketone, cyclopentanone, and cyclohexanone; and aromatic solvents such as toluene and xylene. In this case, the solid content of the epoxy resin composition (that is, the total amount of all the components except for the solvent; the same goes for the following) is usually in the range of 10 to 80 wt %, preferably 20 to 70 wt %, and the rest is the solvent. The viscosity of the solvent-containing epoxy resin composition is usually in the range of 1,000 to 100,000 mPa·s, preferably in the range of 2,000 to 50,000 mPa·s, more preferably in the range of about 3,000 to 20,000 mPa·s from the viewpoint of ease of coating.

The film according to the present invention can be obtained by applying the epoxy resin composition onto a flat substrate by any one of various coating methods known per se, such as gravure coating, screen printing, metal masking, and spin coating so that a coating layer of the epoxy resin composition can have a predetermined dry thickness of, for example, 3 to 500 μm, preferably 5 to 500 μm, in some cases 5 to 30 μm, and then drying the epoxy resin composition. The coating method can be appropriately selected according to the kind, shape, and size of a base material used and the desired thickness of a coating layer to be formed. Examples of the base material include films of various polymers such as polyamide, polyamideimide, polyarylate, polyethylene terephthalate, polybutylene terephthalate, polyether ether ketone, polyether imide, polyether ketone, polyketone, polyethylene, and polypropylene and/or copolymers thereof and metal foils such as copper foil. Among these base materials, a polyimide film and a metal foil are preferred. The film according to the present invention can be heated to obtain a sheet-shaped cured product. Preferred examples of the application of the film according to the present invention include adhesive sheets for flexible printed wiring boards, reinforcing plates for flexible printed wiring boards, coverlays for flexible printed wiring boards, and resin layers of one- or two-sided metal-clad resin laminates (hereinafter, generically called "flexible printed wiring board materials"). The epoxy resin composition according to the present invention functions as an adhesive or a resin layer comprised in these flexible printed wiring board materials. In these applications, the flat substrate often functions as a release film.

Further, a prepreg can be obtained by impregnating a base material such as glass fibers, carbon fibers, polyester fibers, alumina fibers, or paper with the epoxy resin composition according to the present invention containing a solvent and drying the resultant by heating. The thus obtained prepreg can be hot press-molded to obtain a cured product. In this case, the amount of the solvent contained in the epoxy resin composition according to the present invention is usually in the range of 10 to 70 wt %, preferably in the range of 15 to 70 wt % in the mixture of the epoxy resin composition and the solvent.

EXAMPLES

Hereinbelow, the present invention will be described more specifically with reference to the following examples and comparative examples, but the present invention is not limited to these examples.

Example 1

A flask equipped with a thermometer, a cooling tube, and a stirrer was prepared, and the flask was purged with nitrogen gas. In the flask, 1.8 g of 5-hydroxyisophthalic acid, 81.3 g of isophthalic acid, 102 g of 3,4'-diaminodiphenylether, 3.4 g of lithium chloride, 344 g of N-methylpyrrolidone, and 115.7 g of pyridine were placed, and were then stirred and dissolved. Then, 251 g of triphenyl phosphite was added thereto to allow a reaction to proceed at 90° C. for 8 hours. As a result, a reaction mixture containing a phenolic hydroxyl group-containing aromatic polyamide resin (A) according to the present invention represented by the following formula (6) was obtained.

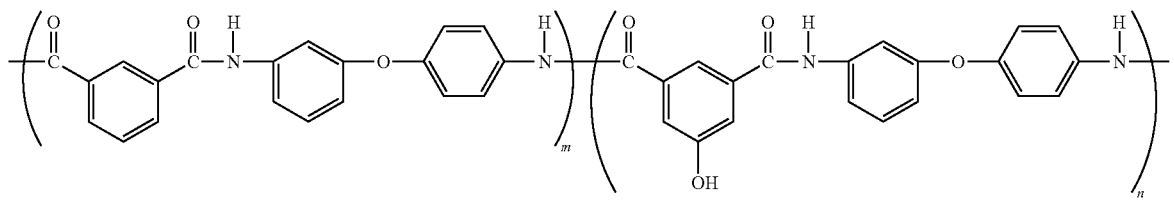

(6)

wherein n/(m+n)=0.022. The reaction mixture was cooled to room temperature, and was then added to 500 g of methanol to precipitate a generated polyamide resin. The precipitated resin was separated by filtration, washed with 500 g of methanol, and purified by reflux with methanol. Then, the reflux fluid was cooled to room temperature, and the resin was separated by filtration and dried to obtain a resin powder (A). The amount of the obtained resin powder (A) was 160 g and the yield was 96%. 0.100 g of the resin powder (A) was dissolved in 20.0 mL of N,N-dimethylacetamide to measure the intrinsic viscosity of the resin using an Ostwald viscometer at 30° C., and the intrinsic viscosity of the resin was found to be 0.50 dl/g. The calculated value of the equivalent weight of active hydrogen to epoxy group of the resin is 3,300 g/eq. The thus obtained polyamide resin according to the present invention has amino groups at both ends, and the average polymerization degree of the polyamide resin is 50 (that is a theoretical average polymerization degree calculated from a feed ratio).

Example 2

A reaction mixture containing a phenolic hydroxyl group-containing aromatic polyamide resin (B) according to the present invention represented by the following formula (7) was obtained in the same manner as in the Example 1 except that 102 g of 3,4'-diaminodiphenylether was replaced with 102 g of 4,4'-diaminodiphenylether:

Example 3

While 100 g of the reaction mixture obtained in the Example 1 was maintained at 90° C., 30 g of ion-exchanged water was added thereto. The reaction mixture was cooled to 60° C. or less to precipitate a resin, and the upper liquid phase was removed. Then, 40 g of N,N-dimethylformamide was added to the precipitated resin, and they were stirred at 60° C. for 30 minutes to uniformly dissolve the resin in N,N-dimethylformamide. Then, 30 g of ion-exchanged water was again added thereto to precipitate the resin. Such a series of precipitation and dissolution steps was repeated 5 times to obtain a resin solution. From the resin solution, water was removed under a reduced pressure of 0.02 MPa to obtain 75 g of a resin composition according to the present invention having a resin content of 20 wt %. The rotational viscosity of the resin composition according to the present invention was measured at 25° C. by placing 1.00 mL of the resin composition in an E-type rotating viscometer, and was found to be 200 mPa·s.

Further, 50 g of the resin composition according to the present invention was charged into 50 g of methanol to precipitate a resin, and the resin was separated by filtration. Then, the resin was washed with 50 g of methanol and purified by reflux with methanol. Then, the reflux fluid was cooled to room temperature, and the resin was separated by filtration and dried to obtain a resin powder. 4 g of the resin

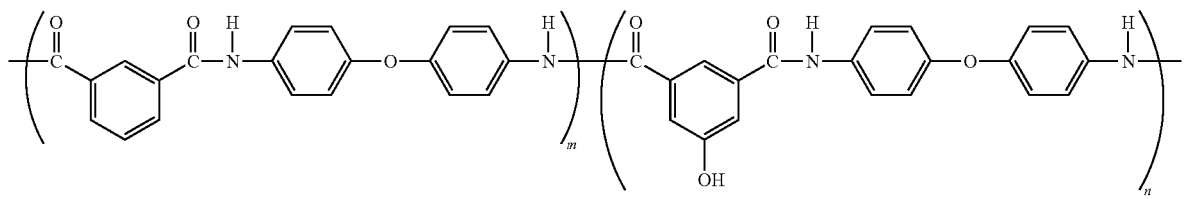

(7)

(wherein n/(m+n)=0.022). The reaction mixture was treated in the same manner as in the Example 1 to obtain a resin powder (B). The amount of the obtained resin powder (B) was 158 g and the yield was 94%. 0.100 g of the resin powder (B) was dissolved in 20.0 mL of N,N-dimethylacetamide to measure the intrinsic viscosity of the resin using an Ostwald viscometer at 30° C., and the intrinsic viscosity of the resin was found to be 0.65 dl/g. The calculated value of the equivalent weight of active hydrogen to epoxy group of the resin is 3,300 g/eq. The thus obtained polyamide resin according to the present invention has amino groups at both ends, and the average polymerization degree of the polyamide resin is 50 (that is a theoretical average polymerization degree calculated from a feed ratio).

powder was treated with 40 g of ion-exchanged water at 121° C. for 20 hours, and the thus obtained water extract was analyzed by ion chromatography. The result of analysis is shown in Table 1.

Example 4

75 g of a resin composition according to the present invention having a resin content of 20 wt % was obtained in the same manner as in the Example 3 except that the reaction mixture obtained in the Example 1 was replaced with the reaction mixture obtained in the Example 2. The rotational viscosity of the resin composition was measured at 25° C. by placing 1.00 mL of the resin composition in an E-type rotating viscometer, and was found to be 380 mPa·s.

Further, 50 g of the thus obtained resin composition according to the present invention was charged into 50 g of methanol to precipitate a polyamide resin according to the present invention, and the precipitated resin was separated by filtration. Then, the resin was washed with 50 g of methanol and purified by reflux with methanol. Then, the reflux fluid was cooled to room temperature, and the resin was separated by filtration and dried to obtain a resin powder. 4 g of the resin powder was treated with 40 g of ion-exchanged water at 121° C. for 20 hours, and the thus obtained water extract was analyzed by ion chromatography. The result of analysis is shown in Table 1.

Example 5

To 120 g of the resin powder (A) obtained in the Example 1, 5.1 g of an epoxy resin NC-3000 (manufactured by Nippon Kayaku Co., Ltd, epoxy equivalent weight: 265 to 285 g/eq), 1.3 g of 2-phenyl-4,5-dihydroxymethylimidazole (2PHZ) as a curing accelerator, and 256 g of N,N-dimethylformamide as a solvent were added, and they were uniformly mixed to obtain an epoxy resin composition according to the present invention.

Example 6

The epoxy resin composition obtained in the Example 5 was applied onto a polyethylene terephthalate (PET) film so as to have a dry thickness of 10 μm, and was then dried at 140° C. for 3 minutes. The PET film was removed to obtain a sheet-shaped film according to the present invention.

Example 7

To 12 g of the resin composition obtained in the Example 3, 0.102 g of an epoxy resin NC-3000 (manufactured by Nippon Kayaku Co., Ltd., epoxy equivalent weight: 265 to 285 g/eq), and 0.026 g of 2-phenyl-4,5-dihydroxymethyl-imidazole (2PHZ) as a curing accelerator were added to obtain an epoxy resin composition according to the present invention.

Example 8

The epoxy resin composition obtained in the Example 7 was applied onto a PET film so as to have a dry thickness of 10 μm, and was dried at 140° C. for 3 minutes. The PET film was removed to obtain a sheet-shaped film according to the present invention.

Example 9

The epoxy resin composition obtained in the Example 5 was applied onto a 25 μm-thick polyimide film (manufactured by Ube Industries. Ltd. under the trade name of UPILEX 25SGA) using a roll coater so as to have a dry thickness of 10 μm, and was dried at 140° C. for 3 minutes to remove the solvent. The adhesive coated surface of the polyamide film having the semi-cured adhesive was attached to a roughened surface of a 18 μm-thick BHN foil (trade name: which is a rolled copper foil manufactured by Japan Energy Corporation), and then they were bonded together by thermocompression at 170° C. and 5 MPa for 60 minutes to obtain a single-sided copper-clad resin laminate. The peel strength between the copper foil and the resin layer of the single-sided copper-clad resin laminate was measured using a Tensilon tester (manufactured by Toyo Baldwin Co., Ltd.) in accordance with JIS C6481. The measurement result is shown in Table 1.

Example 10

The sheet-shaped film obtained in the Example 6 was attached to a 25 μm-thick polyimide film (manufactured by Ube Industries., Ltd. under the trade name of UPILEX 25SGA), and the adhesive coated surface of the polyimide film having the semi-cured adhesive was attached to a roughened surface of a 18 μm-thick BHN foil (trade name: which is a rolled copper foil manufactured by Japan Energy Corporation), and they were bonded together by thermocompression at 170° C. and 5 MPa for 60 minutes to obtain a single-sided copper-clad resin laminate. The peel strength between the copper foil and the resin layer of the single-sided copper-clad resin laminate was measured using a Tensilon tester (manufactured by Toyo Baldwin Co., Ltd.) in accordance with JIS C6481. The measurement result is shown in Table 1.

Example 11

The epoxy resin composition obtained in the Example 5 was applied onto a 25 μm-thick polyimide film (manufactured by Ube Industries. Ltd. under the trade name of UPILEX 25SGA) using a roll coater so as to have a dry thickness of 10 μm, and was then covered with the same another polyimide film and dried at 140° C. for 3 minutes to remove the solvent. Then, the polyimide films were bonded together by thermocompression at 170° C. and 5 MPa for 60 minutes to obtain a double-sided polyimide-clad resin laminate. The peel strength between polyimide films of the double-sided polyimide-clad resin laminate was measured using a Tensilon tester (manufactured by Toyo Baldwin Co., Ltd.) in accordance with JIS C6481. The thus measured peel strength between the polyimide films was evaluated in place of the peel strength between polyimide films of a double-sided copper-clad resin laminate obtained by bonding together two single-sided polyimide-clad copper plates so that the polyimide film surfaces thereof faced to each other. The measurement result is shown in Table 1.

Example 12

The sheet-shaped-film obtained in the Example 6 was sandwiched between 25 μm-thick polyimide films (manufactured by Ube Industries. Ltd. under the trade name of UPILEX 25SGA), and they were bonded together by thermocompression at 170° C. and 5 MPa for 60 minutes. The peel strength between polyimide films of the resultant was measured using a Tensilon tester (manufactured by Toyo Baldwin Co., Ltd.) in accordance with JIS C6481. The thus measured peel strength between the polyimide films was evaluated in place of the peel strength between polyimide films of a double-sided copper-clad resin laminate obtained by bonding together two single-sided polyimide-clad copper plates so that the polyimide film surfaces thereof faced to each other. The measurement result is shown in Table 1.

Comparative Example 1

A reaction mixture containing a phenolic hydroxyl group-containing aromatic polyamide resin (C) represented by the above formula (6) (wherein n/(m+n)=0.5) was obtained in the same manner as in the Example 1 except that the amount of 5-hydroxyisophthalic acid used was changed to 45.5 g and that the amount of isophthalic acid used was changed to 41.5 g. Then, the reaction mixture was treated in the same manner as in the Example 1 to obtain a resin powder (C). The amount of the obtained resin powder (C) was 165 g and the yield was 97%. 0.100 g of the resin powder (C) was dissolved in 20.0 mL of N,N-dimethylacetamide to measure the intrinsic viscosity of the resin using an Ostwald viscometer at 30° C., and the intrinsic viscosity of the resin was found to be 0.56 dl/g. The calculated value of the equivalent weight of active hydrogen to epoxy group of the resin is 580 g/eq.

Comparative Example 2

75 g of a comparative resin composition having a resin content of 20 wt % was obtained in the same manner as in the Example 3 except that the reaction mixture obtained in the Example 1 was replaced with the reaction mixture obtained in the Comparative Example 1. The rotational viscosity of the resin composition was measured at 25° C. by placing 1.00 mL of the resin composition in an E-type rotating viscometer, and was found to be 280 mPa·s.

Further, 50 g of the resin composition was charged into 50 g of methanol to precipitate a comparative resin, and the precipitated resin was separated by filtration. Then, the resin was washed with 50 g of methanol and purified by reflux with methanol. Then, the reflux fluid was cooled to room temperature, and the resin was separated by filtration and dried to obtain a resin powder. 4 g of the resin powder was treated with 40 g of ion-exchanged water at 121° C. for 20 hours, and the thus obtained water extract was analyzed by ion chromatography. The result of analysis is shown in Table 1.

Comparative Example 3

A comparative epoxy resin composition was obtained in the same manner as in the Example 5 except that the resin powder (A) was replaced with 120 g of the resin powder (C) obtained in the Comparative Example 1.

Comparative Example 4

A single-sided copper-clad resin laminate was obtained in the same manner as in the Example 9 except that the epoxy resin composition obtained in the Example 5 was replaced with the epoxy resin composition obtained in the Comparative Example 3. The peel strength between the copper foil and the resin layer of the single-sided copper-clad resin laminate was measured using a Tensilon tester (manufactured by Toyo Baldwin Co., Ltd.) in accordance with JIS C6481. The measurement result is shown in Table 1.

Comparative Example 5

A double-sided polyimide-clad resin laminate was obtained in the same manner as in the Example 11 except that the epoxy resin composition obtained in the Example 5 was replaced with the epoxy resin composition obtained in the Comparative Example 3. The peel strength between the polyimide films of the double-sided polyimide-clad resin laminate was measured using a Tensilon tester (manufactured by Toyo Baldwin Co., Ltd.) in accordance with JIS C6481. The measurement result is shown in Table 1.

TABLE 1

|  | Ionic Impurity Content/ppm | | | Organic Impurity Content/ppm | Peel Strength (N/cm) | |
|---|---|---|---|---|---|---|
|  | $PO_3^{3-}$ | $PO_4^{3-}$ | $Cl^-$ | phenol | Adherend Polyimide-Copper Foil | Adherend Polyimide-Polyimide |
| Example 3 | 5 | 1 | 2 | 600 |  |  |
| Example 4 | 7 | 3 | 5 | 730 |  |  |
| Example 9 |  |  |  |  | 16.6 |  |
| Example 10 |  |  |  |  | 11.8 |  |
| Example 11 |  |  |  |  |  | 6.0 |
| Example 12 |  |  |  |  |  | 5.2 |
| Comparative Example 2 | 150 | 10 | 20 | 2000 |  |  |
| Comparative Example 4 |  |  |  |  | 7.9 |  |
| Comparative Example 5 |  |  |  |  |  | 3.4 |

As has been described above, the phenolic hydroxyl group-containing polyamide resin according to the present invention has a much lower ionic impurity content than the comparative polyamide resins, and also has excellent adhesiveness.

The invention claimed is:

1. A polyamide resin obtained by polycondensing hydroxyisophthalic acid, isophthalic acid and either 3,4-diaminodiphenylether or 4,4-diaminodiphenylether in the presence of a phosphite ester, a pyridine derivative and an inorganic salt, the polyamide resin having a structure represented by the following formula (5):

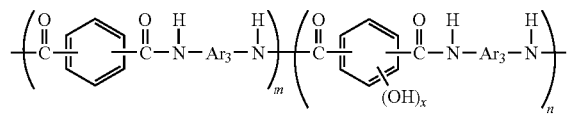

(5)

wherein m and n are average values satisfying the following formula: $0.01 \leq n/(m+n) \leq 0.03$, m+n is a positive value of 30 to 200, x represents the average number of substituents and is a positive value of 1 to 4, and $Ar_3$ is a bivalent aromatic group of the following formula that is a residue of 3,4-diaminodiphenylether or 4,4-diaminodiphenylether:

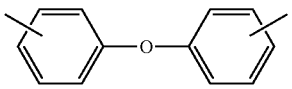

the polyamide resin having an equivalent weight of active hydrogen capable of reacting with an epoxy group of 2,000 to 10,000 g/eq, and both ends of said polyamide resin are amino groups.

2. The polyamide resin according to claim 1, which has an intrinsic viscosity as measured at a concentration of 0.5 gi/dl in N,N-dimethylacetamide solution at 30° C. of 0.3 to 4.0 dl/g.

3. A film obtained by forming an epoxy resin composition comprising the following components: (1) the polyamide resin according to claim 1; and (2) only an epoxy resin or both an organic solvent and an epoxy resin, into a sheet shape.

4. A cured product of the film according to claim 3.

5. An adhesive sheet for flexible printed wiring boards, comprising: a layer composed of an epoxy resin composition comprising the following components: (1) the polyamide resin according to claim 1; and (2) only an epoxy resin or both an organic solvent and an epoxy resin, a layer composed of a film obtained by forming said epoxy resin composition into a sheet shape, or a layer composed of a cured product thereof.

6. A reinforcing plate for flexible printed wiring boards, comprising: a layer composed of an epoxy resin composition comprising the following components: (1) the polyamide resin according to claim 1; and (2) only an epoxy resin or both an organic solvent and an epoxy resin, a layer composed of a film obtained by forming said epoxy resin composition into a sheet shape, or a layer composed of a cured product thereof.

7. A coverlay for flexible printed wiring boards, comprising: a layer composed of an epoxy resin composition comprising the following components: (1) the polyamide resin according to claim 1; and (2) only an epoxy resin or both an organic solvent and an epoxy resin, a layer composed of a film obtained by forming said epoxy resin composition into a sheet shape, or a layer composed of a cured product thereof.

8. A single- or double-sided metal-clad resin laminate characterized in that a metal foil or a polyimide-clad metal foil is bonded to one side or both sides of a layer composed of an epoxy resin composition comprising the following components: (1) the polyamide resin according to claim 1; and (2) only an epoxy resin or both an organic solvent and an epoxy resin, or of a layer composed of a film obtained by forming said epoxy resin composition into a sheet shape, or of a layer composed of a cured product thereof so that one surface of the metal foil or the polyimide film surface of the polyimide-clad metal foil is brought into contact with the surface(s) of the layer.

9. A flexible printed wiring board, comprising a layer composed of an epoxy resin composition comprising the following components: (1) the polyamide resin according to claim 1; and (2) only an epoxy resin or both an organic solvent and an epoxy resin, a layer composed of a film obtained by forming said epoxy resin composition into a sheet shape, or a layer composed of a cured product thereof.

* * * * *